United States Patent [19]

Tsukamoto et al.

[11] Patent Number: 5,406,459
[45] Date of Patent: Apr. 11, 1995

[54] SURFACE MOUNTING MODULE FOR AN ELECTRIC CIRUCUIT BOARD

[75] Inventors: Masahide Tsukamoto, Nara; Seiichi Nakatani; Toru Ishida, both of Hirakata, all of Japan

[73] Assignee: Matsushita Electric Industrial Co., Ltd., Osaka, Japan

[21] Appl. No.: 939,000

[22] Filed: Sep. 2, 1992

[30] Foreign Application Priority Data

Sep. 5, 1991 [JP] Japan .................. 3-225930

[51] Int. Cl.6 .......................................... H05K 1/16
[52] U.S. Cl. ................................. 361/768; 361/767; 174/260; 174/261
[58] Field of Search ............... 174/250, 266, 262, 261, 174/255, 258, 260; 361/790, 795, 792, 767, 768

[56] References Cited

U.S. PATENT DOCUMENTS

| | | | |
|---|---|---|---|
| 3,795,047 | 3/1974 | Abolafia et al. | 174/262 X |
| 4,563,543 | 1/1986 | Kursuzan et al. | 174/68.5 |
| 4,715,117 | 12/1987 | Enomoto | 29/851 |
| 4,803,450 | 2/1989 | Burgess et al. | 361/414 X |
| 4,928,387 | 5/1990 | Mather et al. | 29/840 |
| 5,025,116 | 6/1991 | Kawakami et al. | 174/250 |
| 5,359,494 | 10/1994 | Morimoto | 361/760 |

FOREIGN PATENT DOCUMENTS

| | | |
|---|---|---|
| 3439047 | 4/1986 | European Pat. Off. . |
| 484756 | 5/1992 | European Pat. Off. ............ 174/250 |
| 9105035 | 7/1992 | European Pat. Off. . |

Primary Examiner—Leo P. Picard
Assistant Examiner—L. Thomas
Attorney, Agent, or Firm—Ratner & Prestia

[57] ABSTRACT

An electric circuit board module includes a substrate with electric components mounted on one side thereof and electrodes provided on the other side thereof for the electric connection with the mounted electrical components. The electric circuit board module further includes conductor columns adhered to the electrodes and an adhesion layer provided on the other side of the substrate and around the conductor columns such that the conductor columns extrude from the adhesion layer by a predetermined length. By pressing the electric circuit board module against a separate circuit board to mount thereon, the electric components are electrically connected with electrodes of the sperate circuit board through conductor columns. Since conductor columns are made of a resinous paste with metallic powders dispersed therein, no heating operation as required in conventional module using a solder flow is necessary, resulting in that electric components are kept from the degradation caused by the heat.

7 Claims, 5 Drawing Sheets

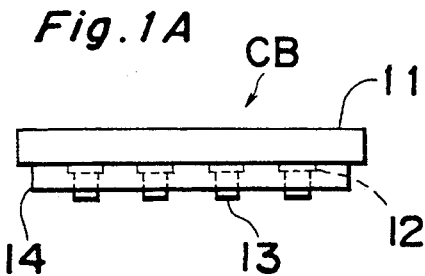
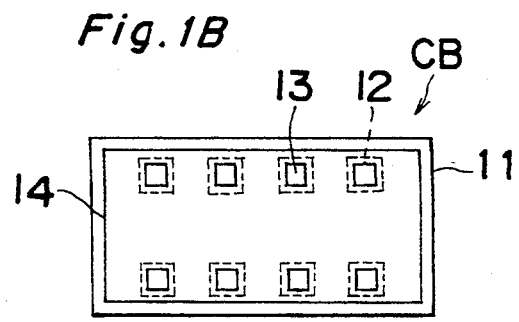
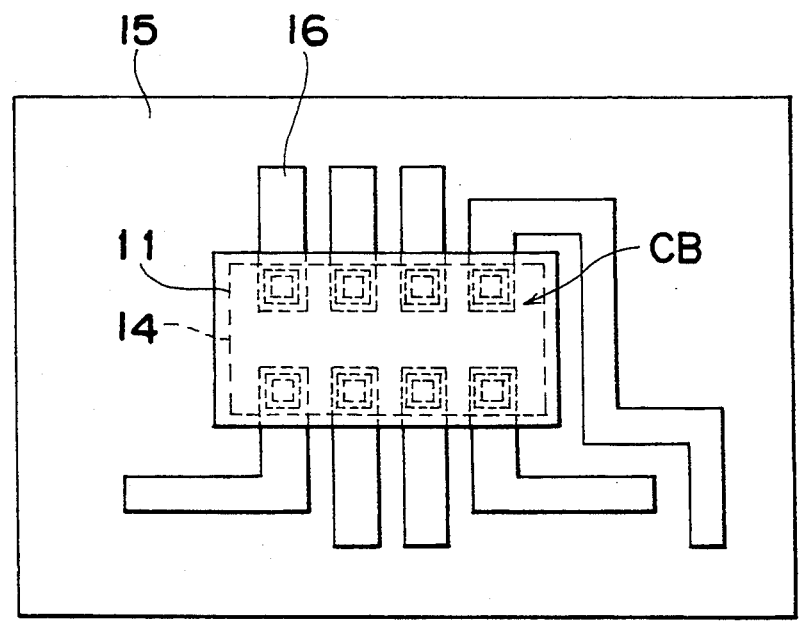
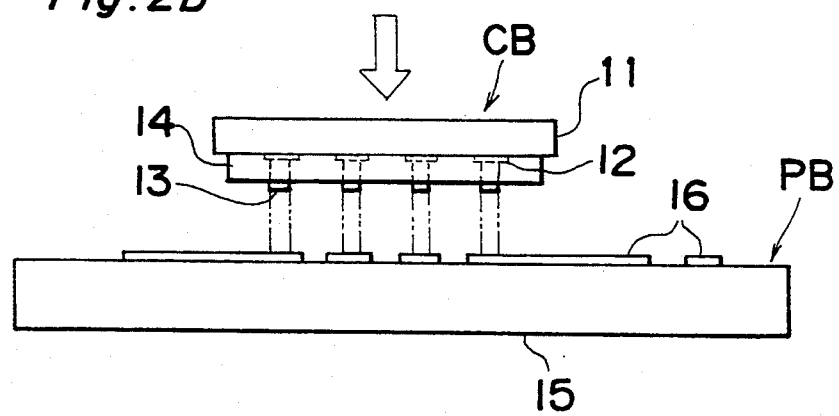

SURFACE MOUNTING MODULE FOR AN ELECTRIC CIRUCUIT BOARD

BACKGROUND OF THE INVENTION

1. Field of the Invention

The present invention relates to an electric circuit board module for mounting various kinds of electric components such as resistors, capacitors, integrated circuit (IC) devices, hybrid IC devices, and substrates on an electric circuit board and, more particularly, to a multi-layer circuit board including plural electric circuits with those electric components mounted thereon.

2. Description of the Prior Art

Conventionally, electric components such as registers, capacitors, IC devices, hybrid IC devices, and substrates are mounted on the electric circuit board mainly by one of the following two methods. The first method is a flow soldering in which the electric circuit board substrate with electric components adhered at the predetermined position thereof is moved over a flowing wave of molten solder to solder the electronic components. The second method is a reflow soldering in which the heat is applied to the electric circuit board substrate, which is coated with a soldering paste at the predetermined positions and has electric components mounted thereon, to form a joint by reflowing the solder.

As demands for the down-sizing and cost reduction of the electronic devices, the high integration of the electric components mounted on an electric circuit board has become increasingly important, resulting in the smaller electric components and the electric circuit board with electrodes at a fine pitch such as 150 μm. However, the previous two methods have soldering errors such as a short circuit caused by a solder bridge and an incomplete joint caused by a solder ball, when applied for soldering such smaller electric components on the electric circuit board with fine pitch electrode.

Especially in the reflow soldering, since the soldering paste easily degrades due to oxidization of the metallic components included therein, it is difficult to obtain the fine soldering paste good for printing on such fine-pitch-electrode circuit boards. Furthermore, both in the flow and reflow soldering methods, since the soldering paste shall be heated up to a high temperature for making molten solder, electric components joined by the soldering are affected significantly by the heat, causing the degradation of the electric components. The joints between electric components and the circuit board are unreliable.

SUMMARY OF THE INVENTION

The object of the present invention is therefore to provide an imaging device which solves these problems.

The present invention has been developed with a view to substantially solving the above described disadvantages and has for its essential object to provide an improved electric circuit board module.

In order to achieve the aforementioned objective, an electric circuit board module comprises a substrate having a first surface for mounting an electric component thereon and a second surface, an electrode means provided on said second surface for electric connection with said electrical component, a conductor means provided on said electrode means in an electric connection therewith; and an adhesion means provided on said second surface and around said conductor means such that said conductor means extrudes from said adhesion means by a predetermined length.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which:

FIG. 1A is a side view of an electric circuit board with an adhesive layer and conductor columns provided at the bottom according to the present invention;

FIG. 1B is a plan view, viewed from the bottom, of the electric circuit board shown in FIG. 1A;

FIG. 2A is a plan view showing the electric circuit board shown in FIGS. 1A and 1B placed over a printed circuit board;

FIG. 2B is a side view of the electric circuit board and the printed circuit board shown in FIG. 2A;

DETAILED DESCRIPTION OF THE PREFERRED EMBODIMENTS

Figure 3:
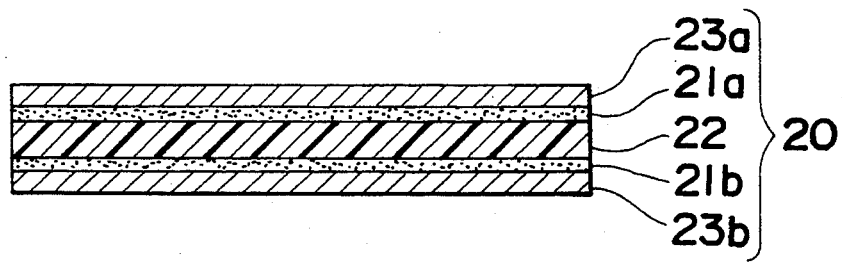
FIGS. 3 to 6 are cross sectional views showing the processes to provide the substrate of the electric circuit shown in FIG. 1A with an adhesive layer and adhesive columns.

Referring to FIGS. 1A and 1B, an electric circuit board according to the present invention is shown. The electric circuit board CB includes a substrate 11 made of resinous material, and a plurality of electrodes 12 provided on the bottom surface of the substrate 11. A conductor column 13, made of an adhesive and electrical conductive material such as soldering paste, is provided on each of electrodes 12. An adhesion layer 14, made of an adhesive and electrical insulating material, is provided on the bottom surface of the substrate 11 and surrounding the conductor columns 13. Each column 13 has height slightly greater than the thickness of the adhesion layer 14. So that the free end face of the conductor columns 13 is located slightly above the surface of the adhesion layer 14. For the adhesion layer 14, any type of adhesive materials such as thermoplastic adhesives, thermosetting adhesives, and cold-setting adhesives can be used. However, a thermosetting material which is usually adhesive but is set when heated is preferable for the application for the convenience of manufacturing. For the conductor column 13, the usual soldering pastes can be used, but an electrically conductive pastes made of the conductive resin-vehicle with golden or silver powders dispersed therein is preferable.

Although the electrode 12 and the conductor column 13 are shown to be generally square-shaped in cross section in FIG. 1B, any other shapes such as rectangular, circle, oval shape are also allowed. It is to be noted that any of electric component parts such as resistors, capacitors, coils, IC devices, other electric circuit boards, or circuit board substrates can be provided on the substrate 11, but is omitted in FIGS. 1A and 1B for the sake of brevity.

For mounting a single component, such as a resistor or a capacitor, usually two electrodes 12 are necessary on the electric circuit board CB.

For mounting an electric component module, an IC or an electric circuit board, several to several hundreds of electrodes are necessary on the electric circuit board CB. It is to be noted that these electrodes are preferably arranged at the same plane of the electric circuit board CB so that all of the electrodes can be electrically connected by a single processing step.

Referring to FIGS. 2A and 2B, the electric circuit board CB mounted on a printed circuit board is shown. The printed circuit board PB includes a substrate 15 and a plurality of electrodes 16 printed on the substrate 15 in a pattern for receiving the conductor columns 13, as shown in FIG. 2A. When the electric circuit board CB is placed on the printed circuit board PB, conductor columns 13 contact and adhere to corresponding electrodes 16. Then, when a pressure is applied on the electric circuit board CB, as shown by an arrow in FIG. 2B, the full surface of the adhesion layer 14 firmly adheres to the printed circuit board PB. Thus, both of electrodes 12 and 16 are electrically connected through the conductor columns 13 only by placing the electric circuit board CB on the printed circuit board PB with some pressure. When compared with the conventional methods using molten solder, no heating is necessary to form the conductive columns 13. Therefore, the electric components, substrates, and boards can be free from a high temperature. The time necessary to join electric components to the electric circuit board is reduced. Additionally, the reliability of completed electric circuit board is increased.

It is, of course, possible to use the conductor column 13 made of thermosetting material such as epoxy resin where some mechanical strength is required for the conductor column 13. Even in this case, the temperature required to harden the thermosetting material is low enough to keep the electric components free from the degradation.

Referring to FIGS. 3, 4, 5, and 6, an example of method to form the conductor columns 13 arranged in the adhesion layer 14 is described.

As shown in FIG. 3, an adhesion tape 20 includes a base tape 22 made of resinous material. A first adhesion layer 21a and a second adhesion layer 21b are provided on the opposite surfaces of the base tape 22, respectively. Two cover layers, made of resinous material or paper, 23a and 23b having a thickness several to 75 μm are provided on the first and second adhesion layers 21a and 21b, respectively, in a releasible manner. The adhesion tape 20 having a thickness of approximately 50 μm to 0.5 mm are preferable. As one example of the adhesion tape 20, Double coated-adhesive tape No. 532 made by Nitto Denko Corporation having a thickness of 0.11 mm may be used.

Figure 4:
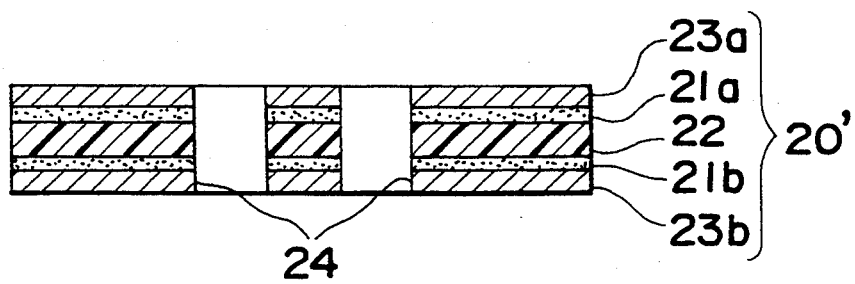
Figure 7A:
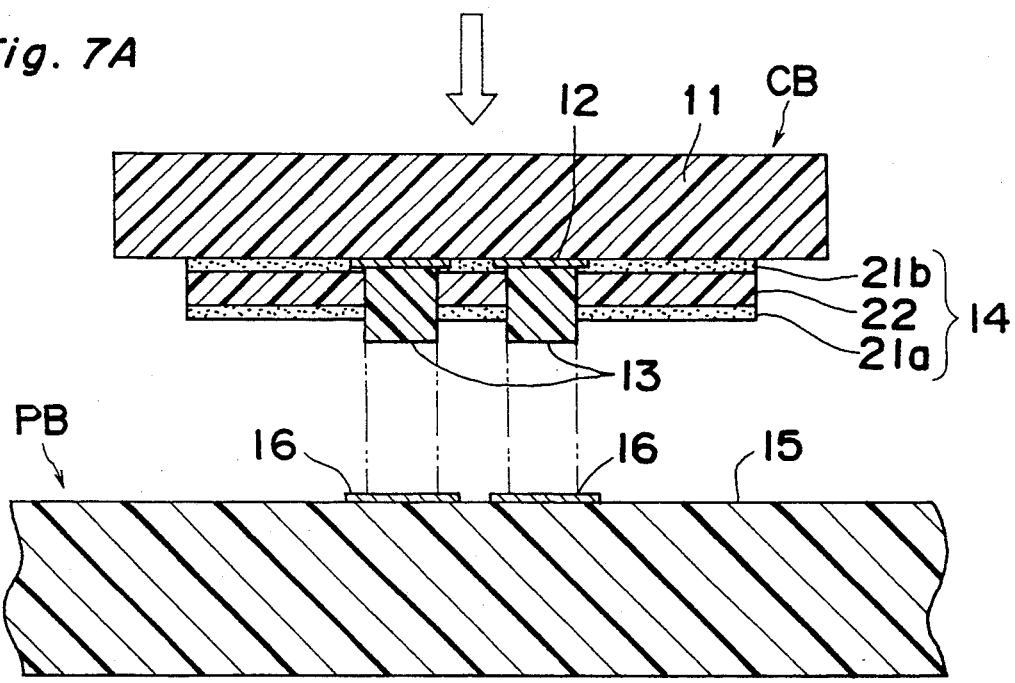
FIG. 7A is a cross sectional side view showing the electric circuit substrate shown in FIG. 6 placed over a printed circuit board.

As shown in FIG. 4, at a first step, a number of through holes 24 each having a predetermined diameter, 0.3 mm, are formed at a predetermined position. After the first step, an adhesion tape 20' with holes 24 is produced. The positions of the through hole 24 are determined with respect to the position of electrodes 16 on the substrate 11 (FIG. 7A). Each through hole 24 has a round shaped in cross section in this embodiment, but any other shapes such as square, rectangular, and oval shape can be employed.

At a second step, the second cover layer 23b is removed from the adhesion tape 20' to expose the second adhesion layer 21b, producing an adhesion tape 20''.

Figure 5:
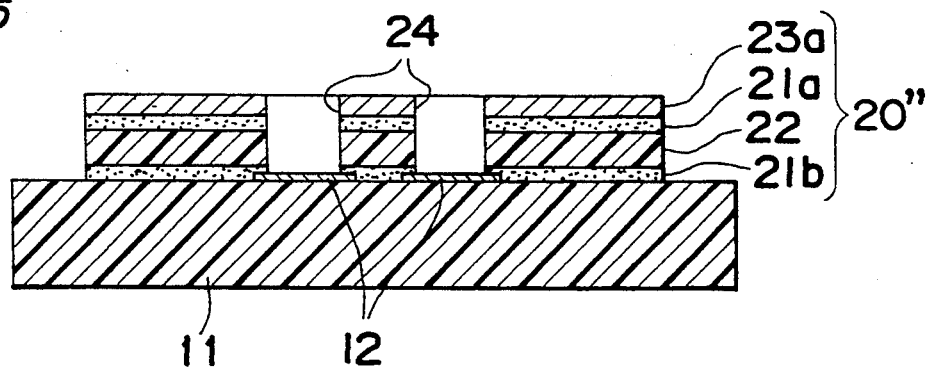

At a third step, the adhesion tape 20'' is pressed against the substrate 11 such that the second adhesion layer 21b contacts the substrate 11 with the through holes 24 located on the corresponding electrodes 12. Thus, the adhesion tape 20'' can be firmly adhered to the substrate 11 without any clearance therebetween, as shown in FIG. 5.

Figure 6:
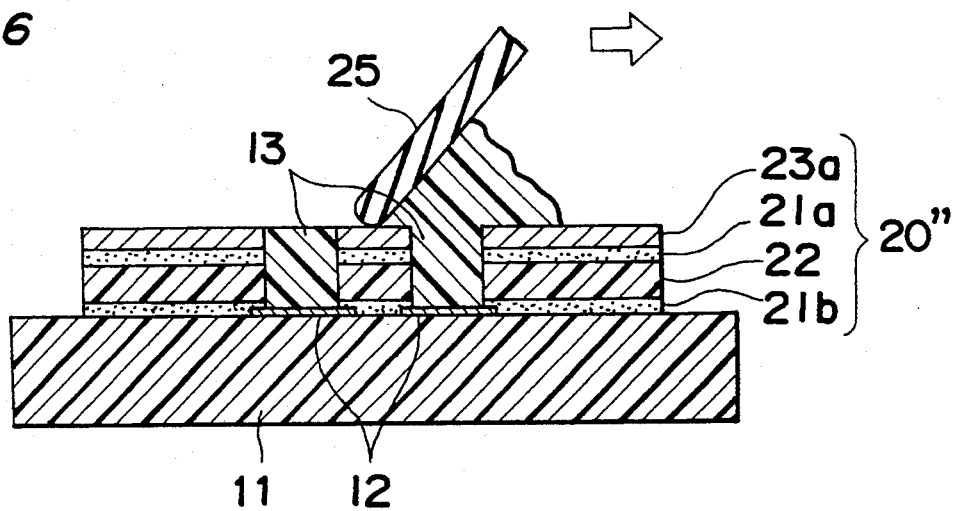

As shown in FIG. 6, at a fourth step, the through holes 24 are filled with an adhesive and electrical conductive material, preferably made of the conductive resin-vehicle with golden or silver powders dispersed therein, by a packing means 25 such as a squeegee. Thus, the conductor columns 13 can be formed in through holes 24, resulting in the electric circuit board CB. It is to be noted that when the first cover layer 23a is removed from the adhesion layer 20'', the adhesion layer 14 is obtained. The first cover layer 23a is preferably removed immediately before mounting the circuit board on the printed circuit board PB, so as to keep the first adhesion layer 21a and conductor column 13 from contaminations by dust or other foreign matters.

It is to be noted that the conductor columns 13 and adhesion layer 14 can be formed by the technique of silk screen printing and injection by dispenser. The adhesion tape 20' with through holes 24 can be used as a mask pattern for forming of the conductor columns 13, simplifying the manufacturing process and increasing the positional precision of conductor columns 13. Therefore, connection errors such as short circuit between electrodes can be prevented.

Figure 7B:
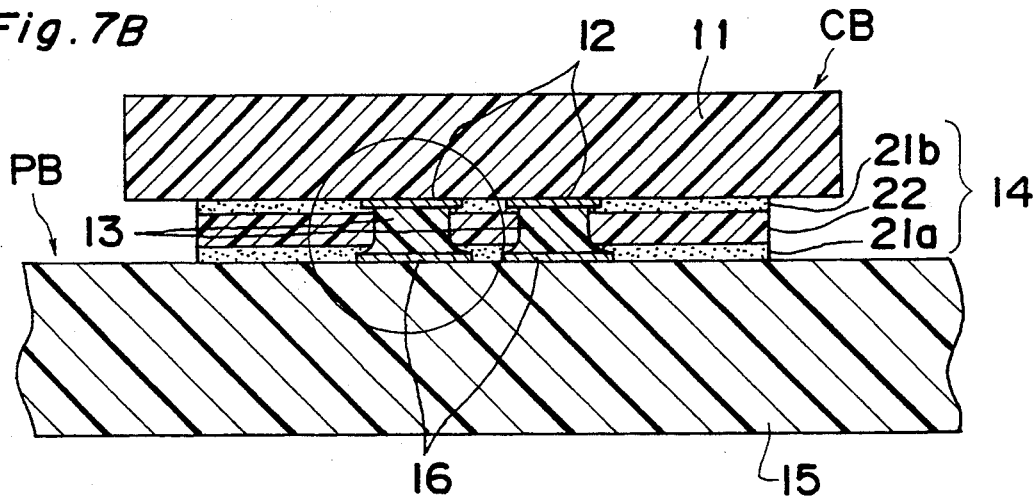
FIG. 7B is a cross sectional side view showing the electric circuit substrate and the printed circuit board shown in FIG. 7A are adhered to each other.
Figure 7C:
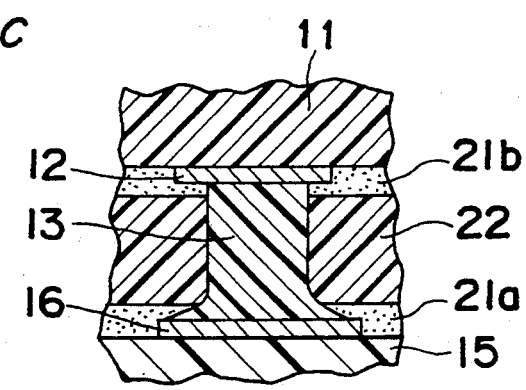
FIG. 7C is a fragmentary sectional view showing, on a large scale, a portion of FIG. 7B which is enclosed by the circle.

Referring to FIGS. 7A, 7B, and 7C, the steps for mounting the electric circuit board CB obtained in a manner described above on a printed circuit board PB is described. First, the electric circuit board CB is placed over the printed circuit board PB such that conductor columns 13 are located over corresponding electrodes 16, as shown in FIG. 7A. Second, the electric circuit board CB is pressed against the printed circuit board PB so that the surface of the substrate 15 is adhered tightly to adhesion layer 21a, as shown in FIG. 7B. The adhesion layers 21a and 21b, base layer 22 and conductor column 13 are deformed to contact with each other without any gap therebetween, as shown in FIG. 7C.

Figure 8A:
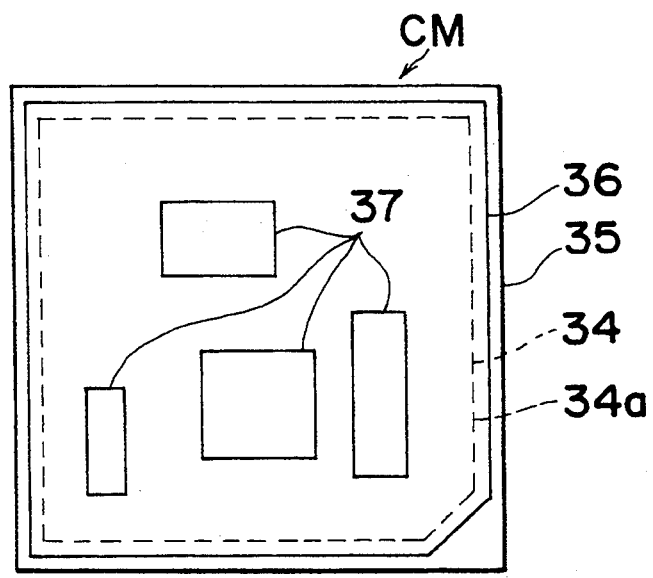
FIG. 8A is a top plan view of an electric circuit board module with electric components mounted thereon.
Figure 8B:
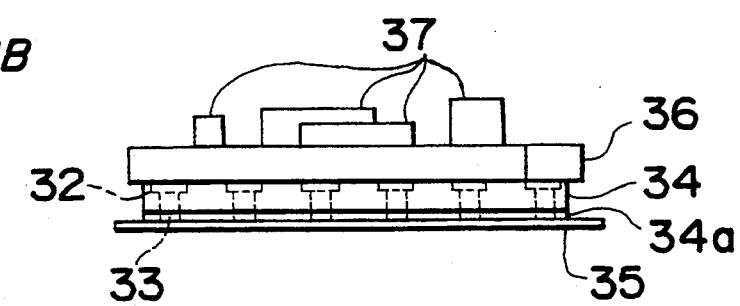
FIG. 8B is a side view of the electric circuit board module shown in FIG. 8A.
Figure 8C:
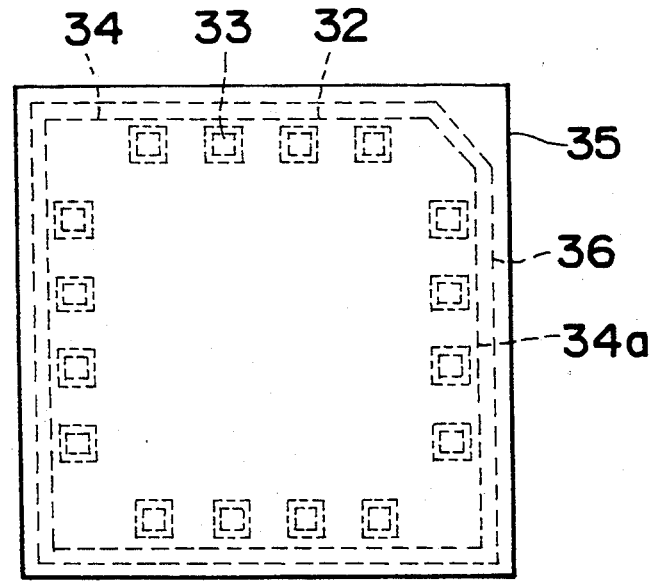
FIG. 8C is a plan view, viewed from the bottom, of the electric circuit board module shown in FIG. 8A.

Referring to FIGS. 8A, 8B, and 8C, an electric circuit board module CM according to the present invention is shown. The electric circuit board module CM is formed by a substrate 36, a plurality of electrodes 32, a plurality of conductor columns 33, and an adhesion layer 34 in a manner similar to that shown in FIG. 6. A first cover layer 34a is not removed from the adhesion layer 34. A protection layer 35, made of resinous material or paper, is additionally provided to cover the end surfaces of conductor columns 33. The electric circuit board module CM further includes electric components 37 mounted thereon and electrically connected to the conductor columns 33 through the electrodes 32.

Figure 9A:
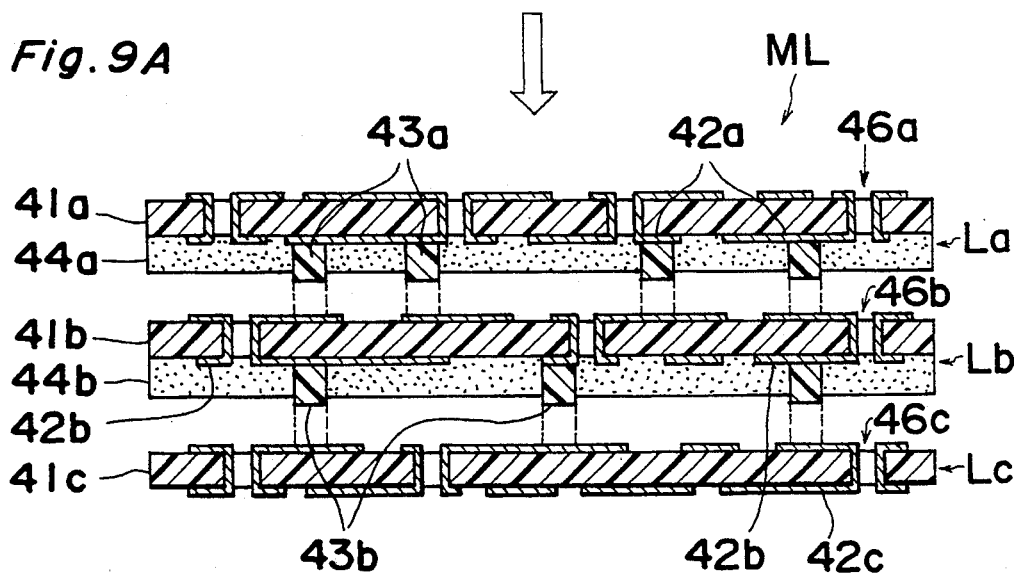
FIG. 9A is a cross sectional side view of a multilayer substrate, before assembling, according to the present invention.
Figure 9B:
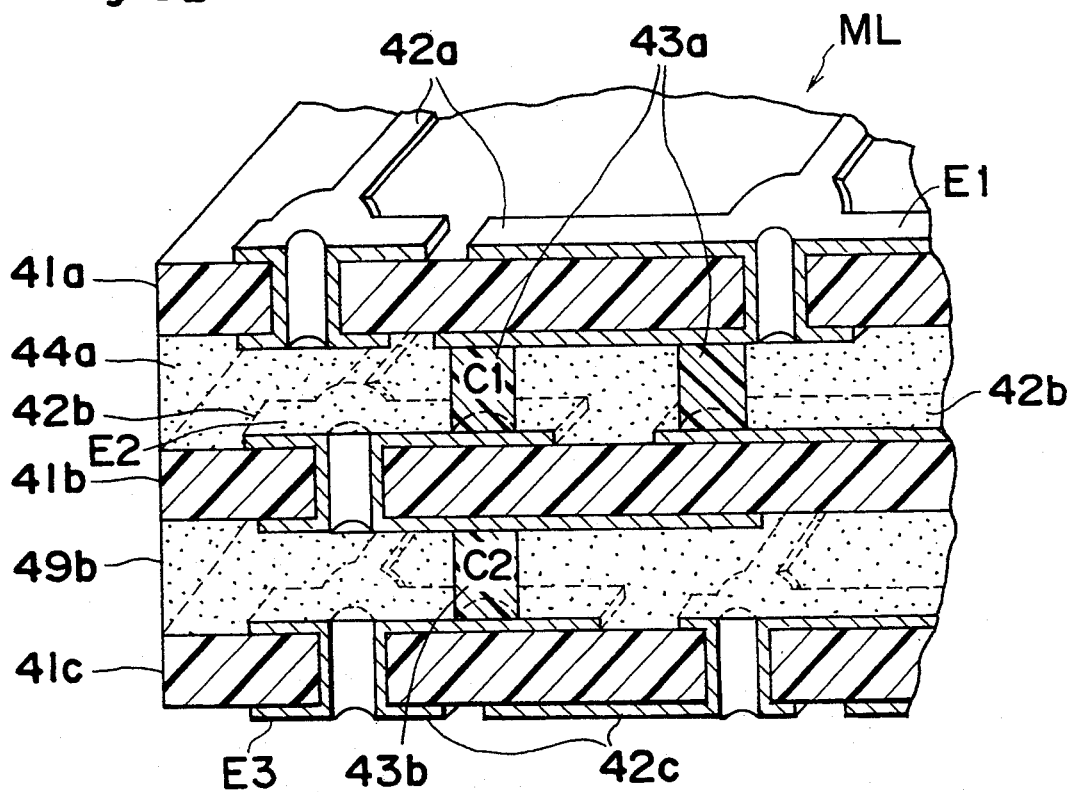
FIG. 9B is a cross sectional perspective view showing the multilayer substrate, after assembling, shown in FIG. 9A.

Referring to FIGS. 9A and 9B, a multilayer substrate according to the present invention is shown. As shown in FIG. 9A, the multilayer substrate ML includes a first dual-layer circuit substrate La. The first dual-layer circuit substrate has a construction very similar to that of the electric circuit board CB described with reference to FIGS. 1A and 1B.

However, a first substrate 41a, a first dual-layer electrode 42a, and a first adhesion layer 44a shown in FIG. 9A correspond to the substrate 11, electrode 12, conductor column 13, and adhesion layer 14 shown in FIG. 1A, respectively. The first substrate 41a is made of a resinous material, such as glass epoxy, and is provided with a plurality of first through holes 46a, each extending between the opposite surfaces thereof. Each of the first dual-layer electrodes 42a has electrode patterns on opposite surfaces of the first substrate 43a, and such electrode patterns are electrically connected by a ring shaped electrode segment extending along the first through hole 46a, as shown.

The multilayer substrate ML further includes a second dual-layer circuit substrate Lb and a third dual-layer circuit substrate 41c, The second dual-layer circuit substrate Lb has a second substrate 41b with a plurality of second through holes 46b, a plurality of second dual-layer electrode 42b, and a second adhesion layer 44b and has a construction similar to that of the first dual-layer circuit substrate La, as shown in FIG. 9A. The third dual-layer circuit substrate Lc has a third substrate 41c with a plurality of third through holes 46c and a plurality of third dual-layer electrodes 42c. The third dual-layer circuit substrate Lc has a construction similar to the first dual-layer circuit substrate 41a, but the conductor columns 43a and adhesion layer 44a are removed therefrom.

Three dual-layer circuit substrates La, Lb, and Lc are pressed against each other, and are held together by the first and second adhesion layers 44a and 44b, to produce the multilayer substrate ML, as shown in FIG. 9A. The first, second, and third dual-layer electrodes 42a, 42b, and 42c are electrically connected via inner conductor columns 43a and 43b. For example, in FIG. 9B, electrode E1 and E2 are connected through column C1 and electrodes E2 and E3 are connected through column C2. Thus, a multilayer substrate ML having a construction of six electrode layers connected by inner conductor column is obtained. It is needless to say that the multilayer substrate having more than three dual-layer circuit substrates can be easily obtained by the method of the present invention.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A surface mounting module comprising:
   a substrate having a first surface for mounting an electric component thereon and a second surface;
   an electrode means provided on said second surface for electric connection with a mother printed circuit board;
   a conductor means provided on said electrode means in an electric connection therewith;
   an adhesion means provided on said second surface and around said conductor means; and
   a cover layer which covers said adhesion means except for top surface areas of said conductor means, such that said conductor means extrudes from said adhesion means when said cover layer is removed before mounting said surface mounting module on said mother circuit board.

2. A surface mounting module as claimed in claim 1, wherein said conductor means is comprised of conductive paste having resinous matrix and metallic powders dispersed in said resinous matrix.

3. A surface mounting module as claimed in claim 1, wherein said adhesion means is comprised of an insulating and thermosetting material which is adhesive at room temperature and is hardened at a high temperature.

4. A surface mounting module as claimed in claim 1, wherein said adhesion means comprising:
   a first adhesion layer of an insulating and adhesive material adhered to said second surface;
   an intermediate layer of an insulating resinous material adhered to said first adhesion layer; and
   a second adhesion layer of an insulating and adhesive material adhered to said intermediate layer.

5. A surface mounting module as claimed in claim 4, wherein said cover layer is adhered to said second adhesion layer in a separable manner for keeping said second adhesion layer from contamination.

6. A surface mounting module as claimed in claim 1 that further comprises a protection layer provided on said cover layer to protect the top of said conductor means.

7. A multilayer substrate as claimed in claim 6, wherein said adhesion means comprising:
   a first adhesion layer of an insulating and adhesive material adhered to said second surface;
   an intermediate layer of an insulating resinous material adhered to said first adhesion layer; and
   a second adhesion layer of an insulating and adhesive material adhered to said intermediate layer.

* * * * *